United States Patent
Lee et al.

(10) Patent No.: US 8,258,805 B2
(45) Date of Patent: *Sep. 4, 2012

(54) TEST DEVICE AND SEMICONDUCTOR INTEGRATED CIRCUIT DEVICE

(75) Inventors: Sang-Jin Lee, Seoul (KR); Gin-Kyu Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 477 days.

This patent is subject to a terminal disclaimer.

(21) Appl. No.: 12/458,535

(22) Filed: Jul. 15, 2009

(65) Prior Publication Data

US 2010/0013514 A1    Jan. 21, 2010

(30) Foreign Application Priority Data

Jul. 17, 2008  (KR) .................. 10-2008-0069544

(51) Int. Cl.
*G01R 31/26* (2006.01)
*H01L 23/58* (2006.01)
(52) U.S. Cl. .............. 324/762.01; 257/48; 257/E23.002
(58) Field of Classification Search .................. None
See application file for complete search history.

(56) References Cited

U.S. PATENT DOCUMENTS

| | | | |
|---|---|---|---|
| 6,437,455 B2 * | 8/2002 | Mori et al. ..................... | 257/369 |
| 7,994,811 B2 * | 8/2011 | Lee et al. ................. | 324/762.01 |
| 2004/0001376 A1 | 1/2004 | Breitwisch et al. | |
| 2006/0192254 A1 * | 8/2006 | Yokoyama ..................... | 257/379 |
| 2010/0012933 A1 * | 1/2010 | Lee et al. .......................... | 257/48 |
| 2010/0013513 A1 * | 1/2010 | Lee et al. ..................... | 324/765 |
| 2011/0260161 A1 * | 10/2011 | Lee et al. .......................... | 257/48 |

FOREIGN PATENT DOCUMENTS

JP    2006-302330    11/2006
KR    10-2002-0008346    1/2002

* cited by examiner

*Primary Examiner* — Jermele M Hollington
(74) *Attorney, Agent, or Firm* — Harness, Dickey & Pierce, P.L.C.

(57) ABSTRACT

A test device and a semiconductor integrated circuit are provided. The test device may include a first test region and a second test region defined on a semiconductor substrate. The first test region may include a first test element and the second region may include a second test element. The first test element may include a pair of first secondary test regions in the semiconductor substrate extending in a first direction. The second test element may include structures corresponding to the first test element except the second test element does not include structures corresponding to the pair of first secondary test regions.

20 Claims, 5 Drawing Sheets

TEST DEVICE AND SEMICONDUCTOR INTEGRATED CIRCUIT DEVICE

PRIORITY STATEMENT

This application claims priority under 35 U.S.C. §119 to Korean Patent Application No. 10-2008-0069544, filed on Jul. 17, 2008, in the Korean Intellectual Property Office (KIPO), the entire contents of which is herein incorporated by reference.

BACKGROUND

1. Field

Example embodiments relate to a test device and a semiconductor integrated circuit device, and more particularly, to a test device and a semiconductor integrated circuit device, which have improved manufacturability.

2. Description of the Related Art

Static Random Access Memory RAM (SRAM) is relatively faster than Dynamic Random Access Memory (DRAM) but has a relatively smaller memory capacity. Accordingly, SRAMs used in computer systems are usually delegated to roles where a high-speed memory is required. For example, SRAMs are commonly used as processor caches in computers and in portable appliances.

Static memory cells may be classified into thin film transistor (TFT) cells, full complementary metal oxide semiconductor (FCMOS) cells, etc. An FCMOS cell may include a plurality of pull-up transistors and pull-down transistors, which may form a latch, and a plurality of pass transistors that may be used to access to the latch.

As the integration density of semiconductor memory elements has increased, the size of memory cells has reduced. Reducing the size of the memory cell may require reducing the size of the metal contacts. The reduction in contact size may make it difficult to accurately pattern the metal contacts. As a result, defective contacts may be produced resulting in increased contact failures. Particularly, in the static memory cells, adjacent shared contacts may be electrically connected to each other. This is referred to as a bridge.

In order to detect the occurrence of a bridge between adjacent shared contacts, nodes connected to the respective adjacent shared contacts are formed and it is then determined whether current flows between the nodes or not.

If current flows between the nodes, it may be determined that a bridge has occurred between the adjacent shared contacts. However, various parameters may cause a current to flow between the adjacent shared contacts. For example, a current may flow between the nodes due to a short-circuit between adjacent active regions, a short-circuit between a contact and a gate line, and/or a short-circuit between nodes. Therefore, in a case where current flows between nodes connected to a pair of shared contacts, a method of accurately determining a cause of the flowing of the current would be desired.

SUMMARY

Example embodiments provide a test device and a semiconductor integrated circuit device with improved manufacturability.

In accordance with example embodiments a test device may include a first test region and a second test region defined on a semiconductor substrate. The first test region may include a first test element and the second region may include a second test element. The first test element may include a pair of first secondary test regions in the semiconductor substrate extending in a first direction. The second test element may include structures corresponding to the first test element except the second test element does not include structures corresponding to the pair of first secondary test regions.

In accordance with example embodiments a semiconductor integrated circuit may include a semiconductor substrate having a first region and a second region defined thereon. The integrated circuit may include a pair of first conductive type active regions in the first region of the semiconductor substrate. The pair of first conductive type active regions may extend in a first direction and may be separated from each other. The integrated circuit may also include a pair of second conductive type active regions in the first region of the semiconductor substrate. The pair of second conductive type active regions may extend in the first direction and may be separated from the pair of first conductive type active regions. The integrated circuit may also include a pair of first conductive type test active regions in the second region of the semiconductor substrate corresponding to the pair of first conductive type active regions.

The integrated circuit may also include a pair of first gate lines in the first region of the semiconductor substrate. The pair of first gate lines may extend in a second direction different from the first direction and may be separated from each other by an interval. The pair of first gate lines may have ends adjacent to the pair of second conductive type active regions. The integrated circuit may also include a pair of second gate lines in the second region corresponding to the pair of first gate lines.

The integrated circuit may also include a pair of first shared contacts in the first region partially extending to top surfaces of the second conductive type active regions and to an upper part of the ends of the first gate lines adjacent to the pair of second conductive type active regions. The integrated circuit may also include a pair of second shared contacts in the second region corresponding to the pair of first shared contacts.

The integrated circuit may also include a pair of first nodes configured to apply a voltage to the pair of first shared contacts. The integrated circuit may also include a pair of second nodes corresponding to the pair of first nodes and which may be configured to apply a voltage to the pair of the second shared contacts. In accordance with example embodiments the isolation regions may be at regions corresponding to the pair of second conductive type active regions of the second region.

In accordance with example embodiments a semiconductor integrated circuit may include a semiconductor substrate having a first region and a second region defined thereon with isolation regions in the first and second regions. The integrated circuit may also include a plurality of active regions in the first region separated from each other by the isolation regions. The integrated circuit may also include a plurality of gate lines on the first and second regions of the semiconductor substrate. The plurality of gate lines may partially overlap the active regions and the isolation regions in the first region while being on the isolation regions in the second region.

In accordance with example embodiments, the semiconductor integrated circuit may also include an interlayer insulating layer covering a surface of the semiconductor substrate including the first region and the second region. The integrated circuit may also include a first pair of shared contacts in the first region and a second pair of shared contacts in the second region passing through the interlayer insulating layer. The first pair of shared contacts in the first region may contact the active regions and the gate lines in the first region and the second pair of shared contacts in the second region may contact the gate lines and the isolation regions in the second region. The semiconductor integrated circuit may also include a first pair of nodes in the first region that may be electrically connected to the first pair of shared contacts in the first region. The integrated circuit may also include a second pair of nodes in the second region that may be electrically connected to the second pair of shared contacts in the second region.

BRIEF DESCRIPTION OF THE DRAWINGS

The above and other features and advantages of example embodiments will become more apparent by describing in detail example embodiments thereof with reference to the attached drawings in which.

DETAILED DESCRIPTION OF EXAMPLE EMBODIMENTS

Figure 1:
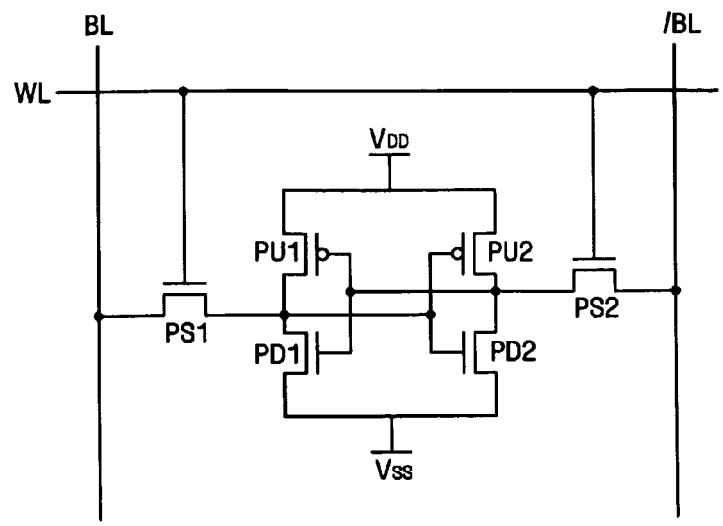
FIG. 1 is a circuit diagram of a static memory cell of a semiconductor integrated circuit device according to example embodiments.

Advantages and features of the example embodiments and methods of accomplishing the same may be understood more readily by reference to the following detailed description of example embodiments and the accompanying drawings. Example embodiments may, however, be embodied in many different forms and should not be construed as being limited to the embodiments set forth herein. Rather, example embodiments are provided so that this disclosure will be thorough and complete and will fully convey the concept of the invention to those skilled in the art, and example embodiments will only be defined by the appended claims. Therefore, in some specific embodiments, well known materials or methods have not been described in detail in order to avoid obscuring the example embodiments.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below", "beneath", "lower", "above", "upper" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

A semiconductor integrated circuit device according to an embodiment of the invention includes a static memory cell region and a test region defined on a semiconductor substrate.

Hereinafter a memory cell region of a semiconductor integrated circuit device according to example embodiments will be described in detail with reference to FIGS. 1 and 2.

FIG. 1 is a circuit diagram of a static memory cell of a semiconductor integrated circuit device according to example embodiments.

Referring to FIG. 1, the semiconductor integrated circuit device according to example embodiments may include a static memory cell. The static memory cell may include a plurality of pull-up transistors PU1 and PU2 and pull-down transistors PD1 and PD2 that may form a latch. A plurality of pass transistors PS1 and PS2 may be used to access to the latch.

A unit cell of the static memory cell may include first and second pass transistors PS1 and PS2, first and second pull-down transistors PD1 and PD2, and first and second pull-up transistors PU1 and PU2. Each of the first and second pass transistors PS1 and PS2 and the first and second pull-down transistors PD1 and PD2 may be an NMOS transistor, and each of the first and second pull-up transistors PU1 and PU2 may be a PMOS transistor.

The first and second pull-down transistors PD1 and PD2 may be connected to a ground line $V_{SS}$, and the first and second pull-up transistors PU1 and PU2 may be connected to a power feed line $V_{DD}$.

In accordance with example embodiments, a unit cell of an SRAM cell may include a first inverter and a second inverter. The first inverter may include a first pull-down transistor PD1 that is an NMOS transistor and a first pull-up transistor PU1 that is a PMOS transistor as illustrated in FIG. 1. The second inverter may be similarly formed by a second pull-down transistor PD2 that is an NMOS transistor and a second pull-up transistor PU2 that is a PMOS as illustrated in FIG. 1.

The first and second inverters may include output terminals connected to the sources of the first and second pass transistors PS1 and PS2, respectively. A latch circuit may be formed by connecting the input terminal of the first inverter to the output terminal of the second inverter, and the output terminal of the first inverter to the input terminal of the second inverter.

In addition, drains of the first and second pass transistors PS1 and PS2 may be connected to first and second bit lines BL and/BL, respectively. The first and second pass transistors PS1 and PS2 may also be connected to a word line WL as shown in FIG. 1.

Figure 2:
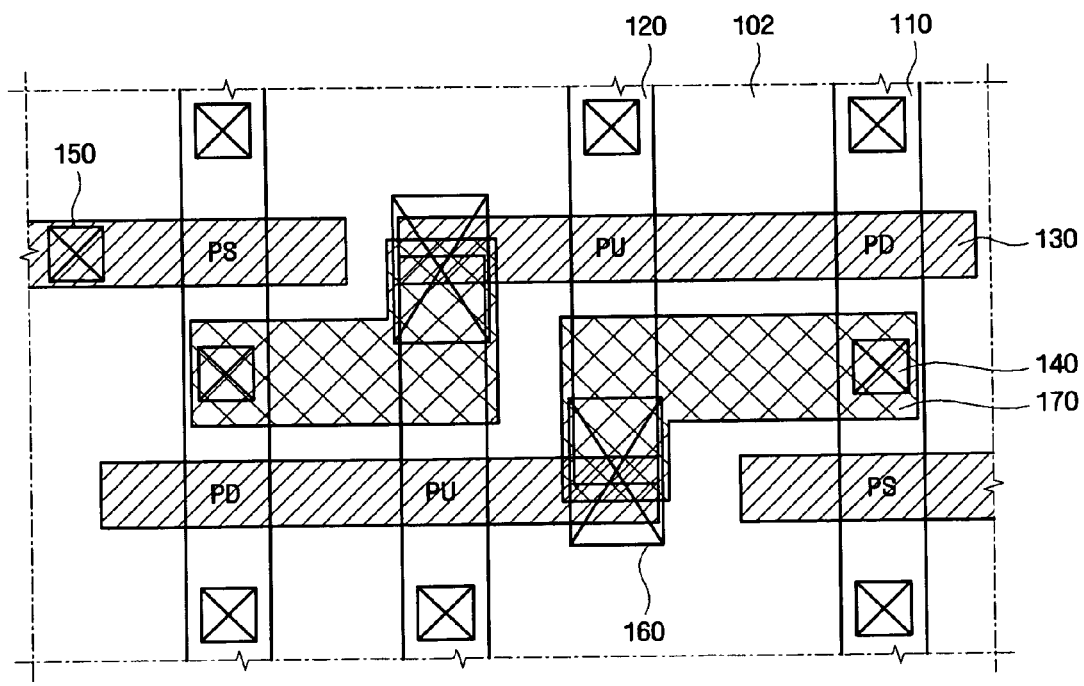
FIG. 2 illustrates a layout of a static memory cell region of the semiconductor integrated circuit device according to example embodiments.

FIG. 2 illustrates a layout of the semiconductor integrated circuit device according to example embodiments.

Referring to FIG. 2, a plurality of first conductive type active regions 110 may be defined by isolation regions 102 and may extend in a first direction on the static memory cell region of the semiconductor integrated circuit device. For example, as shown in FIG. 2, a pair of first conductive type active regions 110 may be provided in the cell region. A plurality of second conductive type active regions 120 may be separated from the first conductive type active regions 110 in the same direction with the first conductive type active regions 110. For example, as shown in FIG. 2, a pair of second conductive type active regions 120 may be provided in the cell region. The second conductive type active regions 120 may extend shorter than the first conductive type active regions 110, however, example embodiments are not limited thereto. For example, the second conductive type active regions 120 may be longer that the first conductive type active regions 110. Here, the first conductive type active regions 110 refer to active regions of a particular conductive type, for example, an N-type, and the second conductive type active regions 120 refer to active regions of a particular conductive type, for example, a P-type. Although FIG. 2 illustrates the plurality of first conductive type active regions 110 and the plurality of second conductive type active regions 120 in pairs, example embodiments are not limited thereto. For example, any number of first conductive type active regions 110 and second conductive type active regions 120 may be provided without departing from the scope of example embodiments A plurality of gate lines 130 traversing the first conductive type active regions 110 or the second conductive type active regions 120 may be formed in a second direction. For example, as shown in FIG. 2, a pair of gate lines 130 is provided in the cell region. In accordance with example embodiments, the second direction may be perpendicular to the first direction in which the first conductive type active regions 110 or the second conductive type active regions 120 are formed. However, example embodiments are not limited thereto. For example, the second direction may in a direction skewed from the first direction. The plurality of gate lines 130 may extend in the second direction and two adjacent gate lines 130 may be adjacent to each other in the first direction as shown in FIG. 2. One end of the gate lines 130 may be formed to be adjacent to a first conductive type active regions 110 or a second conductive type active region 120, or partially or fully overlap a first conductive type active regions 110 or a second conductive type active region 120.

The plurality of gate lines 130 may partially overlap a first conductive type active regions 110 or a second conductive type active regions 120 to form transistors. The transistors formed at the regions overlapping the first conductive type active regions 110 may be N-type transistors, for example, pull-down transistors or pass transistors. The transistors formed at regions overlapping the second conductive type active regions 120 may be P-type transistors, for example, pull-up transistors. A static memory cell may be constituted by a plurality of transistors labeled "PS," "PU" and "PD" in FIG. 2. In FIG. 2, six transistors are shown, however, example embodiments are not limited thereto.

Source/drain regions may be formed at both sides of the regions where the first conductive type active regions 110 or the second conductive type active regions 120 overlap the plurality of gate lines 130. A plurality of first contacts 140 may be formed over some portions of the source/drain regions. The plurality of first contacts 140 may connect the source/drain regions to upper wirings. In addition, second contacts 150 may be formed over some portions of the gate lines 130, and a voltage may be applied to the gate lines 130 through the second contacts 150.

Shared contacts 160 may be formed over the ends of a gate lines 130 adjacent to second conductive type active regions 120 and top surfaces of the second conductive type active region 120. As shown in FIG. 2, a pair of shared contacts 160 may be formed adjacent to each other near the ends of a pair of adjacent second conductive type active regions 120. The shared contacts 160 may have long and short axes, and the pair of shared contacts 160 may be adjacent to each other in the short-axis direction.

Silicide regions may be formed on top surfaces of the first conductive type active regions 110 and the second conductive type active regions 120 not overlapping with the gate lines 130 or over the gate lines 130. The silicide regions may reduce contact resistance between each of the first contacts 140, the second contacts 150 and the shared contacts 160.

A plurality of nodes 170 may be formed over an interlayer insulating layer (not shown) covering the semiconductor substrate having the shared contacts 160. The plurality of nodes 170 may be electrically connected to the plurality of shared contacts 160. A voltage may be applied to the respective shared contacts 160 through the nodes 170. As shown in FIG. 2, a pair of nodes 170 may be provided in the cell region. As shown in FIG. 2, the nodes 170 may be "L" shaped. However, example embodiments are not limited thereto. For example, the nodes 170 may be rectangular, polygon, or curve shaped test nodes.

Figure 3A:
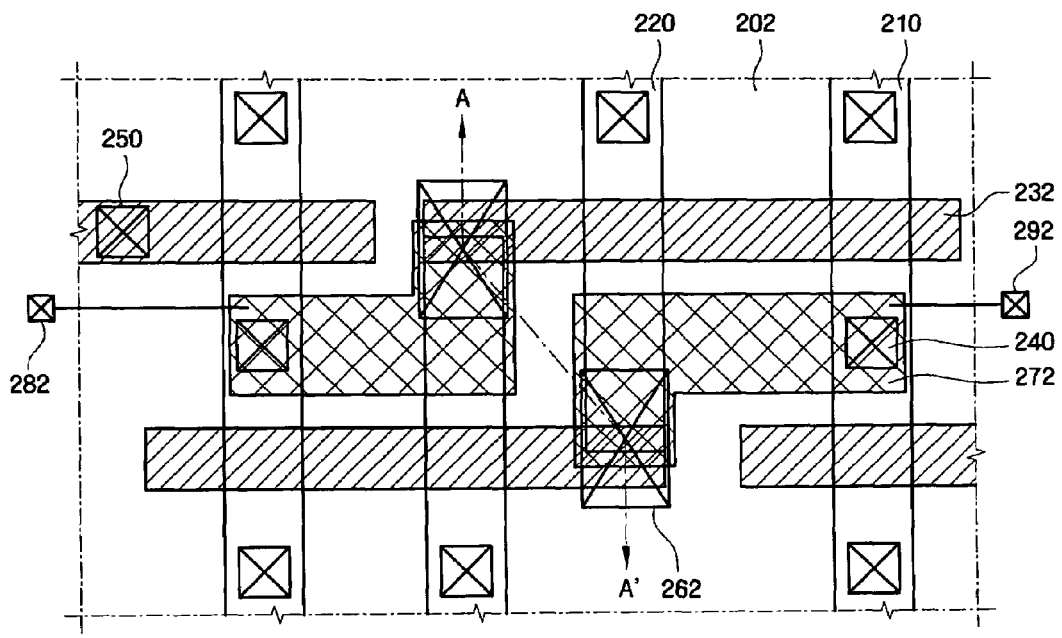
FIG. 3A illustrates a layout of a first test region of the semiconductor integrated circuit device according to example embodiments.
Figure 3B:
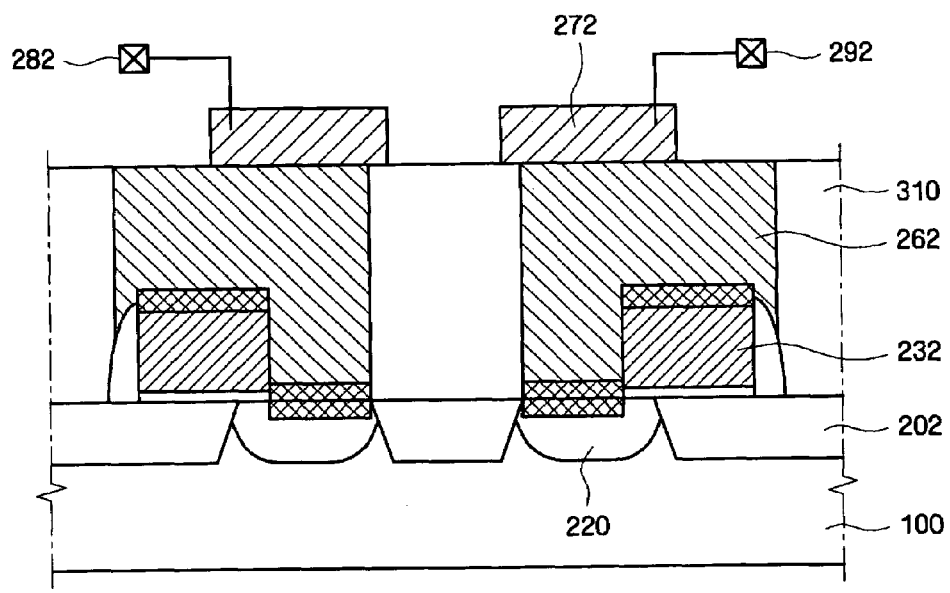
FIG. 3B is a cross-sectional view taken along line A-A' of FIG. 3A.
Figure 4A:
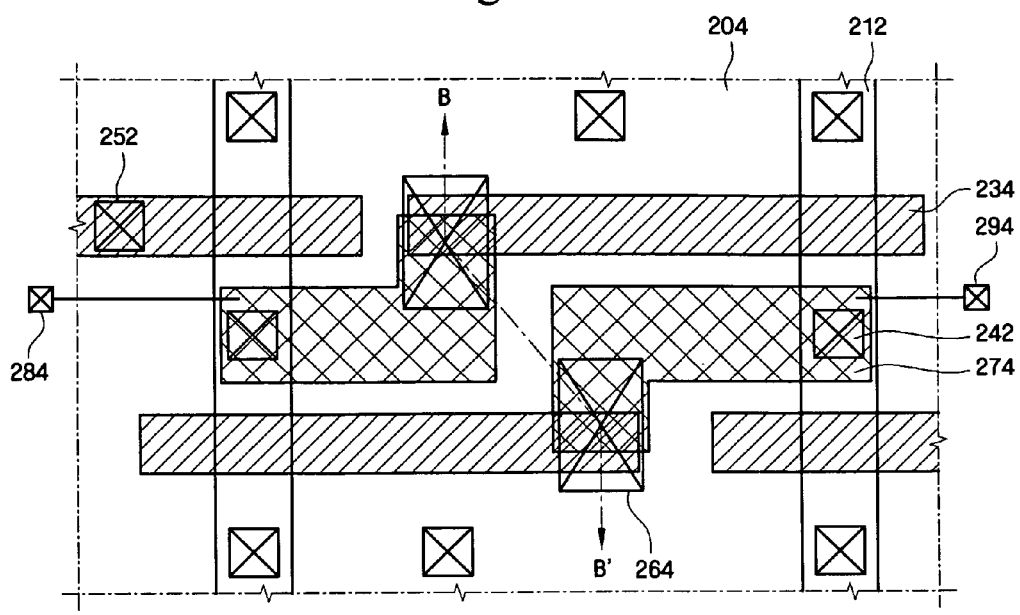
FIG. 4A illustrates a layout of a second test region of the semiconductor integrated circuit device according to example embodiments.
Figure 4B:
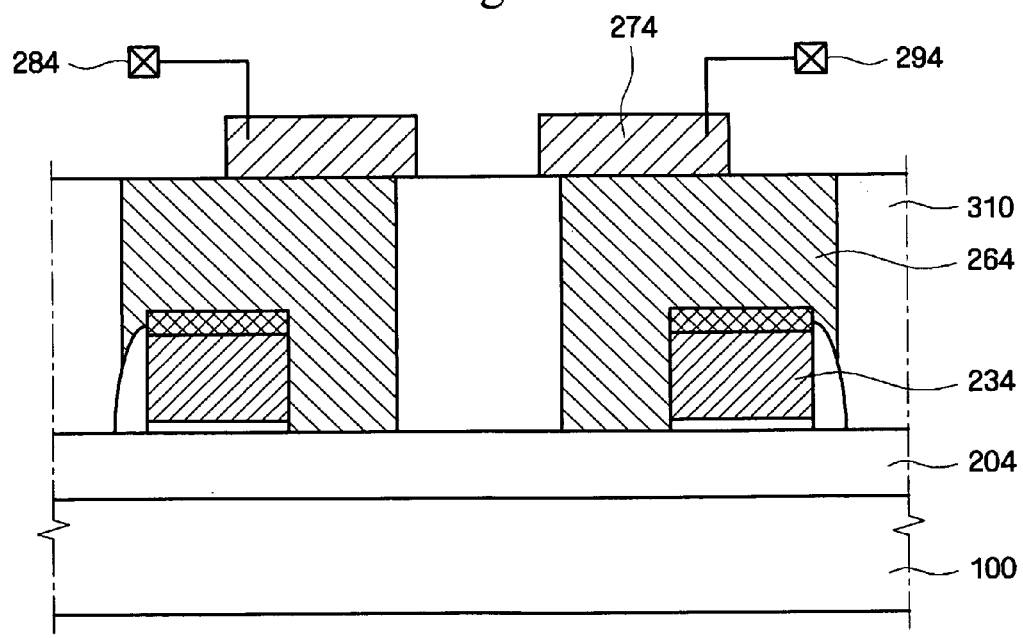
FIG. 4B is a cross-sectional view taken along line B-B' of FIG. 4A.

Hereinafter, test regions of a semiconductor integrated circuit device according to example embodiments will be described with reference to FIGS. 2 through 4B. FIG. 3A illustrates a layout of a first test region of the semiconductor integrated circuit device according to example embodiments, FIG. 3B is a cross-sectional view taken along line A-A' of FIG. 3A, FIG. 4A illustrates a layout of a second test region of the semiconductor integrated circuit device according to example embodiments, and FIG. 4B is a cross-sectional view taken along line B-B' of FIG. 4A. Here, FIG. 2 illustrates a static memory cell region, FIGS. 3A and 3B illustrate an example of a first test region, and FIGS. 4A and 4B illustrate an example of a second test region.

Referring to FIGS. 2 through 3B, the first test region of the semiconductor integrated circuit device according to example embodiments may be formed to have the same layout as that of the static memory cell region illustrated in FIG. 2.

In the first test region first primary test regions 210 extending in a first direction may be provided. The first primary test regions 210 may be conductive type test active regions similar to the first conductive type active region 110 as shown in FIG. 2. For example, the first primary test regions 210 may be N-type active regions. In addition, first secondary test regions 220 may be provided in the first test region. The first secondary test regions 220 may be conductive type test active regions similar to the second conductive type active regions 120 shown in FIG. 2. For example, the first secondary test regions 220 may be P-type active regions. The first primary test regions 210 and the first secondary test regions 220 may be formed to correspond to the first conductive type active regions 110 and the second conductive type active regions 120 of the static memory cell region. Here, what is meant by the phrase "are formed so as to correspond to" is that the first primary test regions 210 and the first secondary test regions 220 are substantially the same or similar to the first conductive type active regions 110 and the second conductive type active regions 120 of the static memory cell region, from the viewpoint of interval, size, material properties, and/or geometry. As shown in FIG. 3A, a pair of first primary test regions 210 and a pair of first secondary test regions 220 may be provided in the first test region. However, example embodiments are not limited thereto.

In the first test region first test gate lines 230 traversing the first primary test regions 210 and the first secondary test regions 220 may be formed. For example, as shown in FIG. 3A, a pair of first test gate lines 230 may be provided in the first test region. The first test gate lines 230 may extend in a second direction which may be perpendicular to the first direction in which the first primary test region 210 was formed. The two adjacent test gate lines 230 may be adjacent to each other in the first direction. The plurality of test gate lines 230 may be formed so as to correspond to the plurality of gate lines 130 of the static memory cell region.

A plurality of first test shared contacts 262 may be formed over ends of at least some of the plurality of test gate lines 230. For example, a pair of first test shared contacts 262 may be provided in the first test region. The plurality of first test shared contacts 262 may be formed so as to correspond to the plurality of shared contacts 160 of the static memory cell region. The respective first test shared contacts 262 have long and short axes, and may be arranged in pair to be adjacent to each other in the short-axis direction. Contacts 240 and 250 may further be formed so as to correspond to the first contacts 140 and the second contacts 150.

First test nodes 272 may be formed over an interlayer insulating layer 310 covering a semiconductor substrate having the first test shared contacts 262. For example, a pair of first test nodes 272 may be provided in the first test region. The first test nodes 272 may be formed so as to correspond to the nodes 170 of the static memory cell region. As shown in FIG. 3A, the first test nodes 272 may be "L" shaped. However, example embodiments are not limited thereto. For example, the first test nodes 272 may be rectangular, polygon, or curve shaped test nodes.

In accordance with example embodiments, the first primary test region 210, the first secondary test region 220, the first test gate lines 232, the first test shared contacts 262, and the first test nodes 272 may form a first test element in the first test region.

First current measuring units and may be connected to the first test nodes 272. The first current measuring units may include first input pads 282 configured to allow current to flow through one of a pair of first test nodes 272 which are adjacent to each other, and first output pads 292 configured to determine whether the current is detected from the other of the pair of first test nodes 272. Accordingly, the occurrence of bridges at the first test shared contacts 262 which are adjacent to each other can be detected by applying a voltage to the first test node 272 connected to one of the pair of first test shared contacts 262 adjacent to each other, and measuring current levels to determine whether there is a change in the current in the other of first test node 272 connected to the pair of first test shared contacts 262.

As described above, the first test region has the same layout as that of the static memory cell region illustrated in FIG. 2.

Referring to FIGS. 3A through 4B, the second test region may be different from the first test region illustrated in FIG. 3A in that no secondary test regions are formed in the second test region. Other than the secondary test regions, the second test region may have substantially the same layout as the first test region. Accordingly, the second test region may have the same layout as the static memory cell region, except for the second conductive type active regions 120.

The second test region may include second primary test regions 212 extending in a first direction. The second primary test regions 212 may be substantially the same as first primary test regions 210. Accordingly, the second primary test regions may be conductive type test active regions similar to the first conductive type active region 110 as shown in FIG. 2. As shown in FIG. 4A, the second primary test regions 212 may be provided as a pair of second primary test regions 212. The second primary test regions 212 may be separated from each other by isolation regions 204. However, unlike in the first test region, no secondary test regions similar to first secondary test regions 220 of the first test region are formed in the second test region. In the second test region, isolation regions 204 may be formed in regions corresponding to a region of the first test region occupied by the first secondary test regions 220.

A plurality of second test gate lines 234 corresponding to first test gate lines 232 in the first test region may be formed in the second test region. As shown in FIG. 4A, a pair of second test gate lines 234 may be provided in the second test region. The second test gate lines 234 may be formed to traverse the second primary test regions 212 in a second direction. As shown in FIG. 4A, the second direction in which the second test gate lines 234 are formed may be perpendicular to the first direction in which the second primary test regions 212 are formed, however, example embodiments are not limited thereto. For example, the second direction may be skewed from the first direction at an angle other than, ninety degrees. Portions of the second test gate lines 234 not overlapping with the second primary test regions 212 may be formed in the isolation regions 204.

A plurality of second test shared contacts 264 are formed on ends of at least some of the plurality of second test gate lines 232. The second test shared contacts 264 may be formed to correspond to the first test shared contacts 262 of the first test region. However, the second test shared contacts 264 may be different from the first test shared contacts 262 in that they may not be connected to secondary test regions. The second test shared contacts 264, however, may be in contact with the second test gate lines 234 and the isolation regions 204.

The second test shared contacts 264 have second test nodes 274 formed thereon to apply a voltage thereto. As shown in FIG. 4A, a pair of second test nodes 274 may be provided to contact a pair of second test shared contacts 264. The second test nodes 274 may be formed to correspond to the first test nodes 272 of the first test region. As shown in FIG. 4A, the second test nodes 274 may be "L" shaped. However, example embodiments are not limited thereto. For example, the second test nodes 274 may be rectangular, polygon, or curve shaped test nodes.

In accordance with example embodiments, the second primary test regions 212, the second test gate lines 234, the second test nodes 274, the second test shared contacts 264 may form a second test element in the second test region. In addition, the second test region may also include contacts 242 and 252 corresponding to contacts 240 and 250, respectively.

Second current measuring units may be connected to the second test nodes 274. The second current measuring units may include second input pads 284 configured to allow a current to flow through one second test node 274 of a pair of second test nodes 274 which may be adjacent to each other, and second output pads 294 for determining whether the current is detected from the other of the pair of second test nodes 274.

Accordingly, the occurrence of bridges at the second test shared contacts 264, which may be adjacent to each other, may be detected by applying a voltage to the second test node 274 connected to one of the pair of second test shared contacts 264 adjacent to each other, and measuring current levels to determine whether there is a change in the current in the second test node 274 connected to the other of the pair of second test shared contacts 264.

Figure 5:
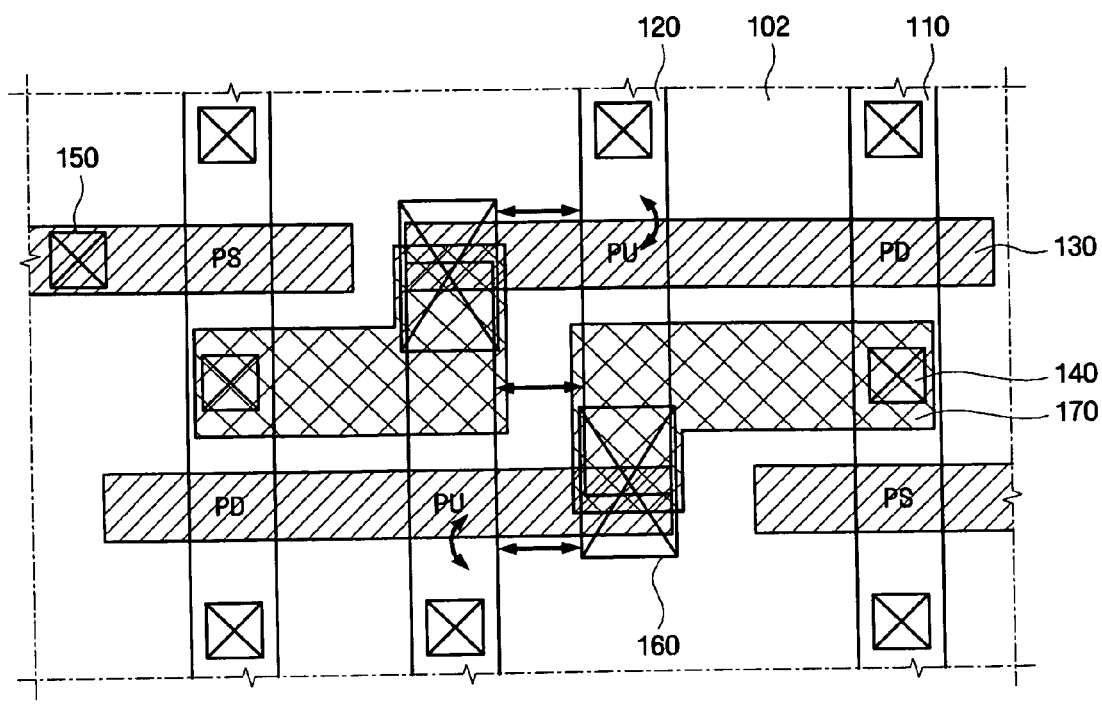
FIG. 5 illustrates testing effects of a semiconductor integrated circuit device according to example embodiments.

FIG. 5 illustrates testing effects of the semiconductor integrated circuit device according to example embodiments.

Referring to FIGS. 2 through 5, various parameters are associated with the occurrence of short-circuit between adjacent nodes in a static memory cell region of a semiconductor integrated circuit device. Accordingly, in a case where adjacent nodes are short-circuited, it may not be easy to determine which structure is defective.

Referring to FIG. 5, when adjacent nodes 170 are short-circuited, the short-circuit may be caused by second conductive type active regions 120, as indicated by arrows. When a pair of second conductive type active regions 120 adjacent to each other are connected to each other, or when the second conductive type active regions 120 are connected to shared contacts 160 adjacent to the second conductive type active regions 120, current may flow between the nodes 170. Further, a gate insulating layer may prevent the second conductive type active regions 120 and the gate lines 130 from being completely electrically disconnected from each other. In this case, current may flow between the nodes 170, suggesting that the nodes 170 may be short-circuited.

The semiconductor integrated circuit device according to example embodiments may include a first test region and a second test region.

In the first test region, it may be determined whether the first test nodes 272 are short-circuited by applying a voltage to one of a pair of the first test nodes 272 which may be adjacent to each other, and observing whether current is detected from the other of the pair of first test nodes 272.

In the second test region, it may be determined whether the second test nodes 272 are short-circuited by applying a voltage to one of a pair of the second test nodes 274 which may be adjacent to each other, and observing current levels of the second output pads 294 to determine whether current is detected from the other of the pair of second test node 274.

If no short-circuit occurs between the second test nodes 274 while the first test nodes 272 are short-circuited, the short-circuit of the first test nodes 272 may be caused by the first secondary test regions 220 because the second test region has the same layout as the first test region but is not provided with secondary conductive test regions similar to the first secondary test region 220.

If the short-circuit occurs between the first test nodes 272 and between the second test nodes 274, the short-circuit occurring between the first test nodes 272 in the first test region is not likely caused by the first secondary test regions 220. This is because the short-circuit has also occurred between the second test nodes 274 in the second test region having no secondary test region similar to the first secondary test region 220 formed in the first test region.

In other words, the semiconductor integrated circuit device according to example embodiments may determine not only the occurrence of short-circuit between the first test nodes 272 adjacent to each other in the first test region but also the occurrence of short-circuit between the first test nodes 272 in the first test region and between the second test nodes 274 in the second test region. By measuring whether or not the first test nodes 272 and second test nodes 274 are bridged, it may be determined whether the short-circuit between the first test nodes 272 in the first test region is caused by the first secondary test region 220.

The semiconductor integrated circuit device according to example embodiments may have the first test region and the second test region formed so as to correspond to the static memory cell region. Therefore, it may be determined why a short-circuit occurs between the first test nodes 272 in the first test region, and the determination result may be reflected in the static memory cell region. Accordingly, the static memory cell region may be tested with improved accuracy, thereby improving manufacturability of static memory cells.

Figure 6:
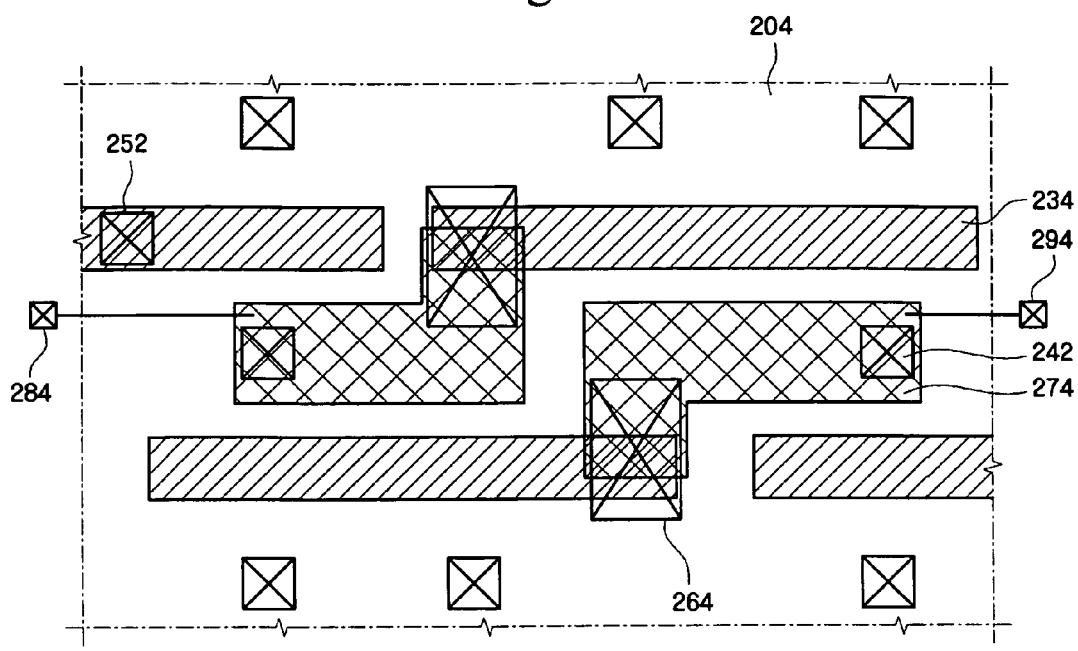
FIG. 6 illustrates a layout of a second test region of the semiconductor integrated circuit device according to example embodiments.

In the semiconductor integrated circuit device according to example embodiments, the second test region of the semiconductor integrated circuit, as shown in FIG. 4A, may include second primary test regions 212 similar to the first primary test regions 210 of the first test region. However, example embodiments are not limited thereto. For example, as shown in FIG. 6, the second test regions may completely lack primary and secondary test regions similar to the first primary test region 210 and the first secondary test regions 220 of the first test region. Other than the first and secondary test regions, the second test region may have the same layout as the first test region. In other words, the layout of the second region shown in FIG. 6, may be identical to the layout of the second region shown in FIG. 4A without the second primary test regions 212.

Unlike the layout of FIG. 4A, FIG. 6 does not include primary test regions similar to the first primary test regions 210 of FIG. 3A. However, the determination of whether or not the short-circuit between the second test nodes 274 is caused by the second conductive type test active regions 220 is little affected by removing all of the first primary test regions and first secondary test regions 210 and 220 of FIG. 3A.

While example embodiments have been particularly shown and described with reference to example embodiments thereof, it will be understood by those of ordinary skill in the art that various changes in form and details may be made therein without departing from the spirit and scope of the following claims.

What is claimed is:
1. A test device comprising:
a first test region and a second test region defined on a semiconductor substrate;
a first test element in the first test region, the first test element including a pair of first secondary test regions in the semiconductor substrate extending in a first direction; and a second test element in the second test region, wherein the second test element includes structures corresponding to structures of the first test element except the second test element does not include structures corresponding to the pair of first secondary test regions.

2. The test device of claim 1, wherein
the first test element includes,
a pair of first primary test regions in the semiconductor substrate extending in the first direction, wherein one of the first primary test regions is separated from the other first primary test region by an isolation region and both of the first primary test regions is separated from the pair of first secondary test regions,
a pair of first test gate lines on the semiconductor substrate extending in a second direction, wherein one of the first test gate lines overlaps one of the first secondary test regions and the other first test gate line overlaps the other first secondary test region,
a pair of first test shared contacts, wherein one of the first test shared contacts is at least partially on one of the first test gate lines and one of the first secondary test regions and the other first test shared contact is at least partially on the other first test gate line and the other first secondary test region,
a pair of first test nodes, wherein one of the first test nodes is electrically connected to one of first test shared contacts and the other first test node is electrically connected to the other first test shared contact, and
the second test element includes
a pair of second primary test regions in the semiconductor substrate, wherein one of the second primary test regions is separated from the other second primary test region by an isolation region and the pair of second primary test regions corresponds to the pair of first primary test regions,
a pair of second test shared contacts corresponding to the pair of first test shared contacts,
a pair of second test gate lines corresponding to the pair of first test gate lines, and
a pair of second test nodes, wherein one of the second test nodes is electrically connected to one of second test shared contacts and the other second test node is electrically connected to the other second test shared contact and the pair of second test nodes corresponds to the pair of first test nodes of the first test element.

3. The test device of claim 2, wherein the first test element further includes a first current detection portion configured to measure a current between the pair of first test nodes.

4. The test device of claim 2, wherein the second test element further includes a second current detection portion configured to measure a current between the pair of second test nodes.

5. The test device of claim 2, wherein a leakage current caused by the first test gate lines is measured by measuring a current between the pair of first test nodes and a current between the pair of second test nodes.

6. The test device of claim 2, further comprising:
a static memory cell region defined in the semiconductor substrate, wherein the static memory cell region includes first conductive type active regions corresponding to the pair of first primary test regions, second conductive type active regions corresponding to the pair of first secondary test regions, first gate lines corresponding to the pair of first test gate lines, first shared contacts corresponding to the pair of first test shared contacts, and first nodes corresponding to the pair of first test nodes and the first test region has substantially the same layout as the static memory cell region.

7. A semiconductor integrated circuit device comprising:
a semiconductor substrate having a first region and a second region defined thereon;
a pair of first conductive type active regions in the first region of the semiconductor substrate, the pair of first conductive type active regions extending in a first direction and separated from each other;
a pair of second conductive type active regions in the first region of the semiconductor substrate, the pair of second conductive type active regions extending in the first direction and separated from the pair of first conductive type active regions;
a pair of first conductive type test active regions in the second region of the semiconductor substrate corresponding to the pair of first conductive type active regions;
a pair of first gate lines in the first region of the semiconductor substrate, the pair of first gate lines extending in a second direction different from the first direction and separated from each other by an interval, the pair of first gate lines having ends adjacent to the pair of second conductive type active regions;
a pair of second gate lines in the second region corresponding to the pair of first gate lines;
a pair of first shared contacts in the first region partially extending to top surfaces of the second conductive type active regions and to an upper part of the ends of the first gate lines adjacent to the pair of second conductive type active regions;
a pair of second shared contacts in the second region corresponding to the pair of first shared contacts;
a pair of first nodes configured to apply a voltage to the pair of first shared contacts; and
a pair of second nodes corresponding to the pair of first nodes and configured to apply a voltage to the pair of the second shared contacts,
wherein isolation regions are at regions corresponding to the pair of second conductive type active regions of the second region.

8. The semiconductor integrated circuit device of claim 7, further comprising:
a first current detection portion configured to detect a current between the pair of first nodes.

9. The semiconductor integrated circuit device of claim 7, further comprising:
a second current detection portion configured to detect a current flow between the pair of second nodes.

10. The semiconductor integrated circuit device of claim 7, wherein a leakage current caused by the second conductive type active regions is measured by determining whether a current flows between the pair of first nodes and between the pair of second nodes.

11. The semiconductor integrated circuit device of claim 7, wherein the first region is a first test region and the second region is a second test region.

12. The semiconductor integrated circuit device of claim 11, further comprising:
a static memory cell region defined in the semiconductor substrate, wherein the active regions in the first test region, the first gate lines, the first shared contacts and the first nodes have substantially the same layouts as those of the static memory cell region.

13. The semiconductor integrated circuit device of claim 7, wherein the first region is a static memory cell region and the second region is a test region.

14. A semiconductor integrated circuit device comprising:
- a semiconductor substrate having a first region and a second region defined thereon;
- isolation regions in the first and second regions;
- a plurality of active regions in the first region separated from each other by the isolation regions;
- a plurality of gate lines on the first and second regions of the semiconductor substrate, the plurality of gate lines partially overlapping the active regions and the isolation regions in the first region while being on the isolation regions in the second region;
- an interlayer insulating layer covering a surface of the semiconductor substrate including the first region and the second region;
- a first pair of shared contacts in the first region and a second pair of shared contacts in the second region passing through the interlayer insulating layer, the first pair of shared contacts in the first region contacting the active regions and the gate lines in the first region and the second pair of shared contacts in the second region contacting the gate lines and the isolation regions in the second region; and
- a first pair of nodes in the first region electrically connected to the first pair of shared contacts in the first region and a second pair of nodes in the second region electrically connected to the second pair of shared contacts in the second region.

15. The semiconductor integrated circuit device of claim 14, wherein the first pair of the shared contacts in the first region and the first pair of nodes in the first region are adjacent to each other and the second pair of the shared contacts in the second region and the second pair of nodes in the second region are adjacent to each other.

16. The semiconductor integrated circuit device of claim 15, further comprising:
- a pair of current detection portions in the first region and the second region, the pair of current detection portions configured to determine whether a current flows between the first pair of nodes and the second pair of nodes.

17. The semiconductor integrated circuit device of claim 16, wherein the current detection portions are configured to measure a leakage current caused by the active regions by determining whether a current flows between the first and second pair of nodes.

18. The semiconductor integrated circuit device of claim 14, wherein the first region is a first test region and the second region is a second test region.

19. The semiconductor integrated circuit device of claim 18, further comprising:
- a static memory cell region in the semiconductor substrate, wherein the first active regions formed in the first test region, the first gate lines, the first shared contacts and the first nodes have substantially the same layouts as those of the static memory cell region.

20. The semiconductor integrated circuit device of claim 14, wherein the first region is a static memory cell region and the second region is a test region.

* * * * *